United States Patent [19]

Fukuda et al.

[11] 4,413,343
[45] Nov. 1, 1983

[54] LEAD CHALCOGENIDE SEMICONDUCTOR DEVICE

[76] Inventors: Hirokazu Fukuda, Asahiso, 1-2-7, Matsunouchi Akashi-shi, Hyogo. 673; Koji Shinohara, 4-6-28, Suganodai, Suma-ku Kobe-shi, Hyogo. 654; Mitiharu Itou, 3-4-34, Seiryodai, Tarumi-ku Kobe-shi, Hyogo. 655, all of Japan

[21] Appl. No.: 236,611

[22] Filed: Feb. 20, 1981

[30] Foreign Application Priority Data

Feb. 22, 1980 [JP] Japan .................................. 55-21999

[51] Int. Cl.$^3$ ............................................... H01S 3/19
[52] U.S. Cl. ...................................... 372/44; 357/17; 357/61; 357/67
[58] Field of Search ..................... 372/44, 45; 357/16, 357/17, 61, 67, 65

[56] References Cited

U.S. PATENT DOCUMENTS 4,350,990 9/1982 Lo ........................................ 357/17

OTHER PUBLICATIONS

Lo et al., "Contact Reliability Studies on Lead-Salt Diode Lasers", Solid-State Science and Technology, Journal of the Electrochemical Society, vol. 127, No. 6, Jun. 1980, pp. 1372 to 1375.

Primary Examiner—James W. Davie

[57] ABSTRACT

In lead chalcogenide semiconductor devices such as PbSSe diode lasers, an element which functions as the acceptor, selected from among the elements forming the relevant semiconductor body, added to gold and the combination is used as the p conductivity type region ohmic contact electrode. Stable continuous wave operation in the infrared region is provided by forming the p conductivity type region ohmic contact electrode for the PbSSe diode laser of a AuSe alloy.

5 Claims, 3 Drawing Figures

LEAD CHALCOGENIDE SEMICONDUCTOR DEVICE

BACKGROUND OF THE INVENTION

1. Field of the Invention

This invention relates to an improvement of a lead chalcogenide semiconductor device, particularly to a structure of novel P conductivity type region contact for lead-salt diode lasers operating in the infrared region.

2. Description of the Prior Art

In general, the lead chalcogenide semiconductors such as lead, sulfur and selenium (Pb, S, Se) are often used as the materials for electro-optical conversion elements in the infrared region. In such a semiconductor element, it is very important to provide an excellent ohmic contact electrode having a low resistance.

A semiconductor light emitting element using a lead chalcogenide multi-element semiconductor as the materials thereof may be a semiconductor laser element (hereinafter referred to only as a laser element). If this is the case, if the electrode has a high contact resistance or is a non-ohmic contact electrode, the wavelength of laser beam fluctuates or it becomes difficult, in the worst case, to allow said laser element to continuously oscillate because the Joule heat is generated at the said electrode part due to a drive current flowing through said laser element and an electrode resistance. This results in an increase in the temperature of the element.

An element structure of an ordinary semiconductor laser element which operates in the infrared region may include a heat sink. The semiconductor part of laser element consists of PbSSe and has n and p conductivity type regions. The laser beam is emitted in a direction from the pn junction surface. The mirror surfaces which structure the resonator are formed as in the case of ordinary laser elements at the element surface from which the laser beam is emitted and its opposite surface.

In addition, the contact electrodes are provided at the n and p conductivity type semiconductor area surfaces, respectively.

In the laser element having such structure, the one contact electrode is provided by the so-called chip bonding method on the copper block coated with indium (In) and functioning as the heat sink. A gold ribbon is bonded via indium brazing on the other contact electrode. The copper block and the gold ribbon thus function as lead-out electrodes.

As explained, gold (Au) has been used ordinarily as the material of the contact electrodes of a laser element consisting of the PbSSe. In this case, since the satisfactory low resistance ohmic contact can be obtained at the surface of the n conductivity type region of the PbSSe semiconductor, because the functions of Au and contact area are almost equal, no particular problem occurs.

However, the p conductivity type region of the PbSSe semiconductor has the disadvantage of causing Joule heat because such region has a comparatively high resistance non-ohmic contact characteristic due to the Schottky barrier generated in a contact area between the p conductivity type semiconductor region and the Au contact electrode. For this reason, ultra-low temperature cooling technology utilizing liquid helium (He) is indispensable for realizing continuous light emitting operation of the lead chalcogenide semiconductor laser element of this type. This requirement has thus made the cost of manufacture and the cost of operation of the device very expensive.

Moreover, a problem of the p conductivity type region contact resistance is also reported in a paper entitled, "Contact Reliability Studies on Lead-Salt Diode Lasers" by W. Lo et al, "Journal of Electrochemical Society", Vol. 127, No. 6, pp. 1372 to 1375. This paper proposes a double-layered Au-Pt electrode structure in order to prevent slow increase in contact resistance due to the migration of indium (In). However, the structure proposed above is still insufficient for decreasing the contact resistance value of the p conductivity type region and thereby eliminating the influence of generation of Joule heat.

It is generally thought advantageous to use a $p^+$ conductivity type electrode contact area of the p conductivity type region in order to obtain the low resistance ohmic contact characteristic of the electrode which is in contact with the surface of said p conductivity type region of said multi-element semiconductor PbSSe. In this case, however, it is currently difficult to previously form the $p^+$ conductivity type layer on the p conductivity type surface of said semiconductor. In other words, the liquid phase epitaxial growth method which is usually employed for formation of such $p^+$ conductivity type layer is not yet established in the field of lead chalcogenide semiconductors including S and Se of this type. Furthermore, it is still impossible to form the $p^+$ conductivity type layer on the surface with satisfactory reproducibility by thermal diffusion method, because control of depth is still difficult.

The principle object of the invention is to provide a lead chalcogenide semiconductor device having a decreased contact resistance.

An object of the invention is to provide a lead chalcogenide multi-element semiconductor device having an electrode structure which assures satisfactory ohmic contact without generation of Schottky barrier on the surface of the p conductivity type region of the lead-chalcogenide multi-element semiconductor device.

Another object of the invention is to provide a ternary lead salt semiconductor diode laser in which the influence of heat generation due to contact resistance is eliminated and stable and continuous oscillation operation is assured.

BRIEF SUMMARY OF THE INVENTION

In accordance with the invention, in a lead chalcogenide semiconductor device having a p conductivity type region, an n conductivity type region, a pn junction between the regions and contact electrodes ohmically contacting the p conductivity type region and the n conductivity type region, respectively, the contact electrode contacting the p conductivity type region consists of gold and an added element of the component elements of the semiconductor device, the contact electrode functioning as the acceptor.

The semiconductor device has the structure of a diode laser consisting of a multi-element semiconductor device including lead and selenium and the contact electrode contacting the p conductivity type region consists of an alloy of gold and selenium.

The contact electrode contacting the p conductivity type region consists of an alloy of gold and selenium including at least 0.05 weight % of selenium.

In accordance with the invention, in a semiconductor laser element, comprising a multi-element semiconductor having a composition of PbSSe, a p conductivity type region having a surface, an n conductivity type region having a surface, a pn junction between the regions and a contact electrode in ohmic contact with the p conductivity type region surface for providing a drive current for laser operation to the pn junction, the contact electrode consists of gold and selenium. The contact electrode consists of an alloy of gold and selenium containing selenium within a range from 0.05 weight % to 5 weight %.

BRIEF DESCRIPTION OF THE DRAWINGS

In order that the invention may be readily carried into effect, it will now be described with reference to the accompanying drawings, wherein.

DETAILED DESCRIPTION OF PREFERRED EMBODIMENTS

Figure 1:
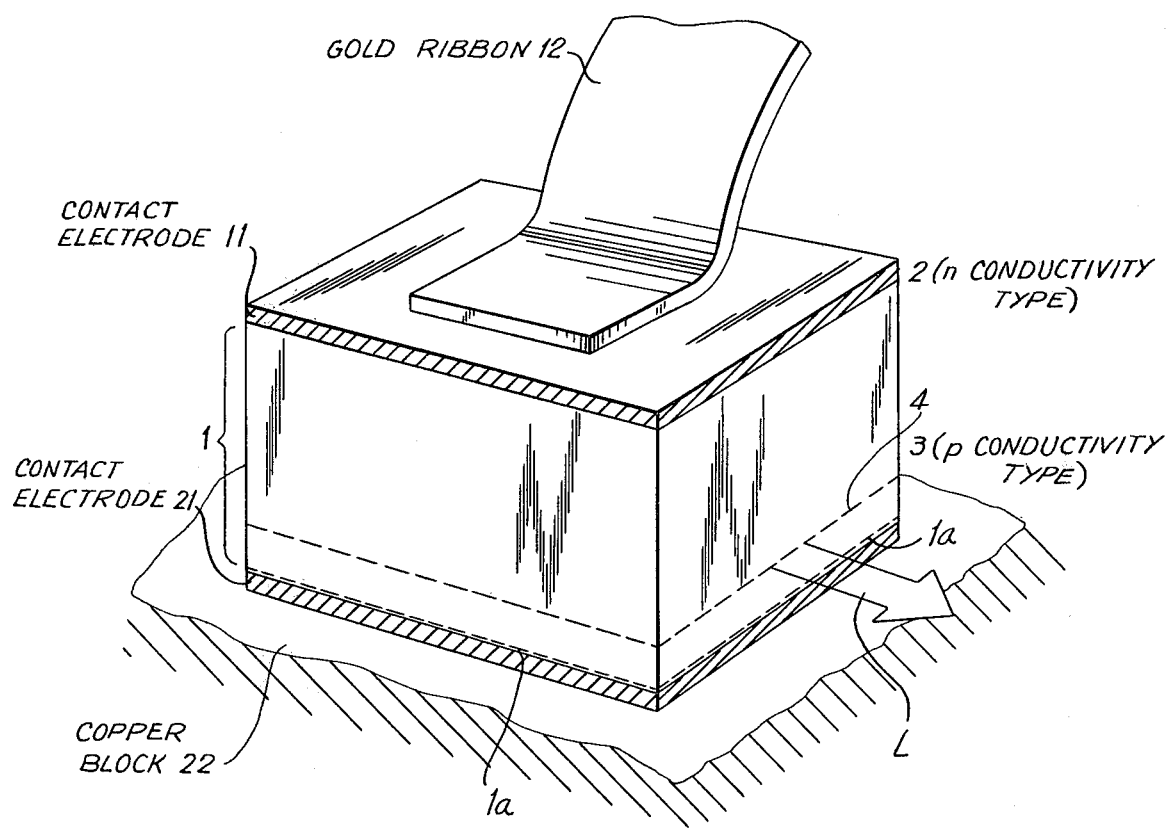
FIG. 1 is a perspective view of an embodiment of a semiconductor diode laser utilizing the semiconductor device of the invention.

FIG. 1 shows an element structure, including the heat sink, of an ordinary semiconductor laser element which operates in the infrared region. In FIG. 1, the semiconductor part 1 of the laser element consists of PbSSe and has an n conductivity type region 2 and a p conductivity type region 3. The laser beam is emitted in a direction indicated by an arrow L from the pn junction surface, which is indicated by a dotted line 4. Although not shown in the FIGS., the mirror surfaces which structure the resonator are formed, as in ordinary laser elements at the element surface from which the arrow L laser beam is emitted and its opposite surface.

In addition, contact electrodes 11 and 21 are provided at n conductivity type and p conductivity type semiconductor region or area surfaces, respectively.

In a laser element having such a structure, the contact electrode 21 is provided by the chip bonding method on a copper block 22 coated with indium (In) and functioning as the heat sink. A gold ribbon 12 is bonded via indium brazing on the other contact electrode 11. The copper block 22 and the gold ribbon 12 thus function as lead-out electrodes.

As explained, gold (Au) has been ordinarily used as the material of the contact electrodes 11 and 21 of a laser element consisting of PbSSe. In this case, since a satisfactory low resistance ohmic contact may be obtained at the surface of the n conductivity type region 2 of the PbSSe semiconductor, because the functions of the gold and the contact area are almost equal, no particular problem occurs.

However, the p conductivity type region 3 of the PbSSe semiconductor has the disadvantage of causing Joule heat, because such region has a comparatively high resistance non-ohmic contact characteristic. This is due to the Schottky barrier generated in the contact area 1a between the p conductivity type semiconductor region 3 and the gold contact electrode 21. For this reason, ultra-low temperature cooling technology utilizing liquid helium (He) is indispensable for realizing continuous light emitting operation of a lead chalcogenide semiconductor laser element of this type. This requirement has thus made the cost of manufacture and the cost of operation of the device very expensive.

Furthermore, a problem of the p conductivity type region contact resistance is also reported in a paper entitled, "Contact Reliability Studies on Lead-Salt Diode Lasers" by W. Lo et al, "Journal of Electrochemical Society", Vol. 127, No. 6, pp. 1372 to 1375. This paper proposes a double-layered gold-platinum electrode structure in order to prevent a slow increase in contact resistance due to the migration of indium (In). However, the proposed structure is still insufficient for decreasing the contact resistance value of the p conductivity type region and thereby eliminating the influence of the generation of Joule heat.

It is generally thought advantageous to use the $p^+$ conductivity type electrode contact area 1a of the p conductivity type region 3 in order to obtain the low resistance ohmic contact characteristic of the electrode in contact with the surface of said p conductivity type region 3 of the multi-element semiconductor PbSSe. However, as hereinbefore stated, the liquid phase epitaxial growth method which is usually utilized for formation of such $p^+$ conductivity type layer is not yet established in the field of lead chalcogenide semiconductors, including S and Se of this type and it is still impossible to form the $p^+$ conductivity type layer on the surface with satisfactory reproducibility by thermal diffusion method, because control of the depth is still difficult.

The semiconductor device of the invention provides an outstanding reduction of contact resistance by forming the electrode with a substance which is one of the component elements of the lead-chalcogenide semiconductor and functions as the acceptor of the semiconductor. Such substance is previously mixed to or alloyed with gold (Au) which is used as the electrode material. Thus, for example, sulphur (S) or selenium (Se) is used as an example, as the acceptor material of said PbSSe semiconductor laser element. In this embodiment, therefore, the mixture (alloy) of Se and Au is used as the material the contact electrode 21 in the p conductivity type semiconductor region 3. For this purpose, first, 2 g of gold (Au) and 40 mg of selenium (Se) are placed, as an example, into the quartz ampoule and heated for an hour at a temperature of 1100° C. In this manner, an alloy of Au and Se of 2% is prepared.

The AuSe alloy is evaporated on the surface of the p conductivity type region 3, which is the rear surface of the chip on which the semiconductor element 1 is formed (FIG. 1), in a thickness of 2000 Å to 3000 Å. Thereafter, this chip is placed on the copper block 22, coated with indium, as mentioned above and then bonded by the chip bonding method at a temperature of 150° C., for example. The Se atoms in the AuSe alloy thereby diffuse into the surface of the p conductivity type region 3. Therefore, the surface area 1a of the p conductivity type region 3 becomes $p^+$ conductivity type in the entire area.

As a result, the surface 1a of the $p^+$ conductivity type area of the PbSSe semiconductor shows an excellent ohmic contact characteristic at a low resistance at the area between the aforedescribed evaporated AuSe electrode. Even when a drive current of several hundred mA is applied to the semiconductor laser element, the temperature does not rise outstandingly and resultingly said laser element can oscillate stably and continuously at a practical cooling temperature using liquid nitrogen (N$_2$).

In addition, the contact electrode 21 of AuSe alloy not only shows an excellent mechanical contact characteristic with indium (In) on the copper block 22, but also is not accompanied by any particular difficulty in the electrode forming process as explained previously.

Figure 2:
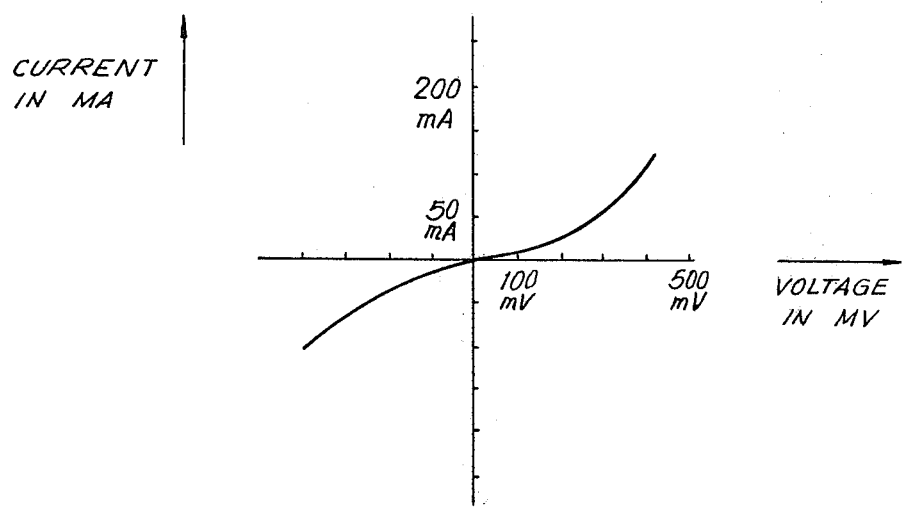
FIG. 2 is a graphical presentation of a voltage v. current characteristic curve of the contact electrode on the p conductivity type side of a semiconductor device of known type.
Figure 3:
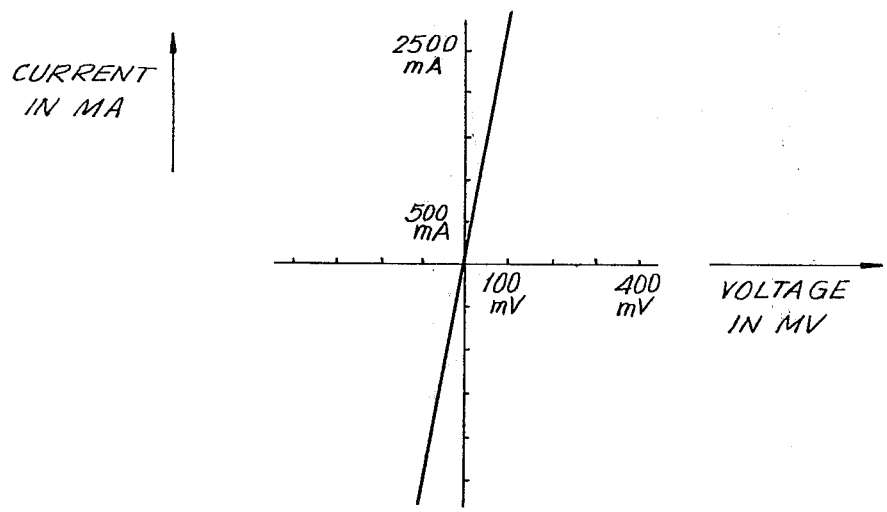
FIG. 3 is a graphical presentation of a voltage v. current characteristic curve of the contact electrode on the p conductivity type side of the semiconductor device of the invention.

According to the experiments conducted by the inventors of the present invention, in case the contact electrode in contact with the p conductivity type region of PbSSe semiconductor consists only of Au, excluding any additives as in the case of the contact electrode of the prior art, the area resistance is about $1\times10^{-3}\Omega$.cm. If such contact electrode consists of a Au alloy including Se of 2% according to the present invention, however, the area resistance is $3\times10^{-6}\Omega$.cm or less and a perfect ohmic voltage vs. current characteristic is obtained. FIGS. 2 and 3 respectively show the voltage vs. current characteristic at the contact areas of the Au electrode of the prior art and the Au-Se (2%) alloy electrode of the present invention for the p conductivity type PbSSe. In each of FIGS. 2 and 3, the abscissa represents the voltage in millivolts and the ordinate represents the current in milliamperes. FIGS. 2 and 3 disclose an obvious improvement in the effect due to the invention. Only comparison in the area resistance indicates that the data obtained by the present invention is lower than that of the electrode of the prior art by two or more digits.

In addition, heat generation when a drive current of 400 mA is applied to a laser element can be estimated as follows. For the known contact electrode of Au, the power loss at the surface of the p conductivity type region is about 0.5 W in an electrode area of 300 microns by 100 microns, but is only about $1.6\times10^{-3}$W for the contact electrode of the invention. Since the thermal resistance of PbSSe is 50° to 100° C./W, the temperature rise of a known laser element based on said power loss becomes 25° to 50° C., is only 0.08° to 0.16° C. if the laser element incorporates the semiconductor device of the invention. If a temperature rise of 10° C. is recorded when the known laser element is operated at the temperature of liquid nitrogen, which is 77° K., the threshold current of laser oscillation increases about 1.4 times whereby the oscillations may stop. However, if the temperature rise is only about 0.16° C., the increment of threshold current can be kept at 1% or less. Resultingly the stable oscillating operation can be ensured only by giving a little margin to the drive current.

The advantageous effects of the device of the invention are obvious from the aforedescribed investigations.

The required concentration of Se to be added to the Au must be at least $1\times10^{19}$/cc in order to provide a sufficient effect. This is about 0.05% in terms of the weight ratio. Although disadvantages do not arise when the Se concentration is increased, the substantial limit may be about 5%, considering the solid-solution limit.

The device of the invention may be adopted to a semiconductor device using not only the aforedescribed PbSSe as the material, but also other lead chalcogenide multi-element semiconductors, such as PbS, PbSe and PbSnSe, etc.

The device of the invention particularly provides considerably advantageous effects concerning practical use in reducing the contact resistance of the contact electrode for the p conductivity type region.

While the invention has been described by means of a specific example and in a specific embodiment, we do not wish to be limited thereto, for obvious modifications will occur to those skilled in the art without departing from the spirit and scope of the invention.

We claim:

1. A lead chalcogenide semiconductor device having a p conductivity type region, an n conductivity type region, a pn junction between said regions and contact electrodes ohmically contacting the p conductivity type region and the n conductivity type region, respectively, said contact electrode contacting said p conductivity type region consisting of gold and an added element of the component elements of said semiconductor device, said contact electrode functioning as the acceptor.

2. A lead chalcogenide semiconductor device as claimed in claim 1, wherein said semiconductor device has the structure of a diode laser consisting of a multi-element semiconductor device including lead and selenium and said contact electrode contacting said p conductivity type region consists of an alloy of gold and selenium.

3. A lead chalcogenide semiconductor device as claimed in claim 2, wherein said contact electrode contacting said p conductivity type region consists of an alloy of gold and selenium including at least 0.05 weight % of selenium.

4. A semiconductor laser element, comprising a multi-element semiconductor having a composition of PbSSe, a p conductivity type region having a surface, an n conductivity type region having a surface, a pn junction between said regions and a contact electrode in ohmic contact with the p conductivity type region surface for providing a drive current for laser operation to said pn junction, said contact electrode consisting of gold and selenium.

5. A semiconductor laser element as claimed in claim 4, wherein said contact electrode consists of an alloy of gold and selenium containing selenium within a range from 0.05 weight % to 5 weight %.

* * * * *

UNITED STATES PATENT AND TRADEMARK OFFICE
CERTIFICATE OF CORRECTION

PATENT NO. : 4,413,343
DATED : November 1, 1983
INVENTOR(S) : Hirokazu Fukuda, Koji Shinohara and Mitiharu Itou It is certified that error appears in the above-identified patent and that said Letters Patent are hereby corrected as shown below:

Title page, after line [76] insert the following line:

[73] Assignee: FUJITSU LIMITED, Kawasaki, Japan after the last line of [56] insert the following line:

Attorney, Agent or Firm - Daniel Jay Tick

Signed and Sealed this

Twenty-ninth Day of January 1985

[SEAL]

Attest:

DONALD J. QUIGG

Attesting Officer

Acting Commissioner of Patents and Trademarks